Figure 1:
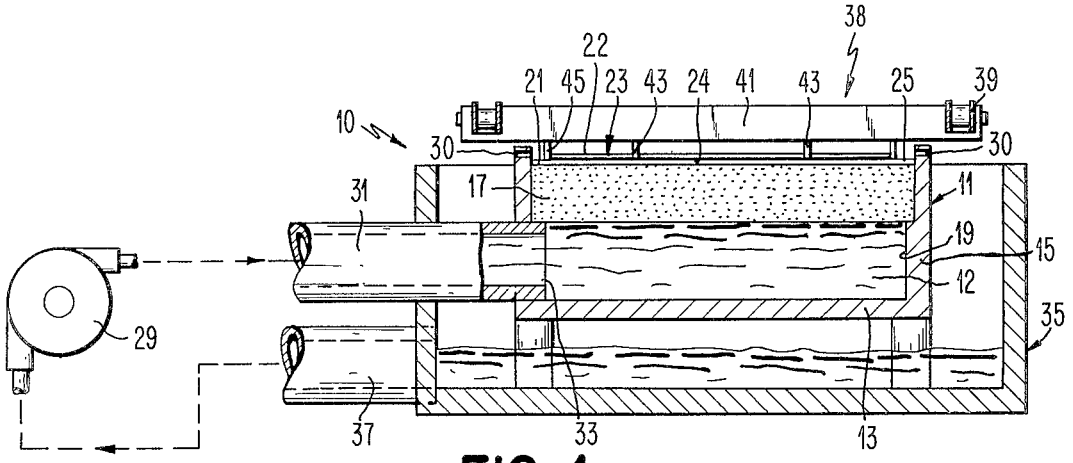
Figure 3:
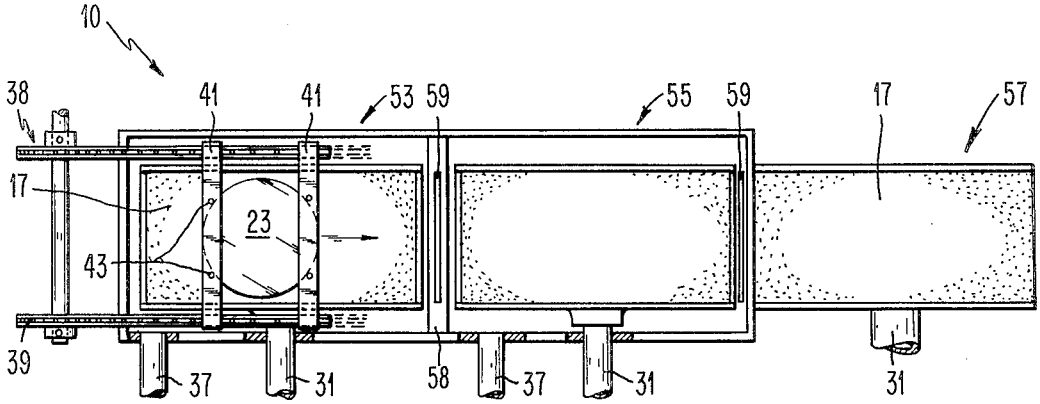
Figure 2:
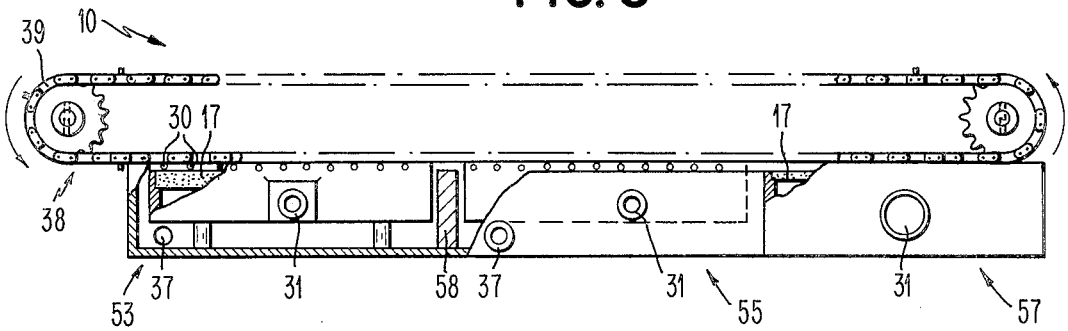
Figure 4:
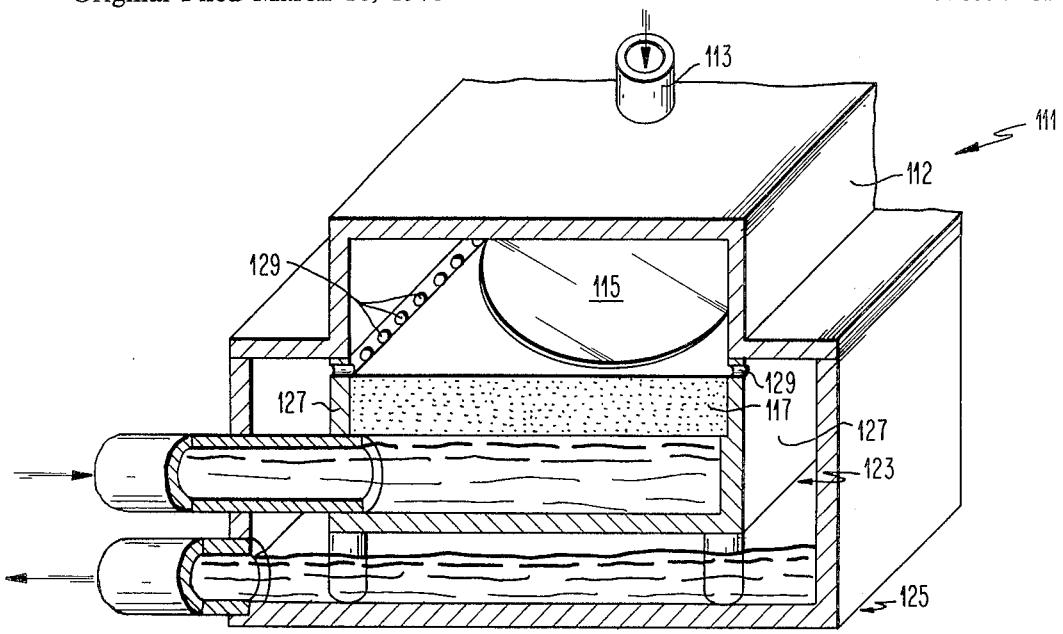
Figure 5:
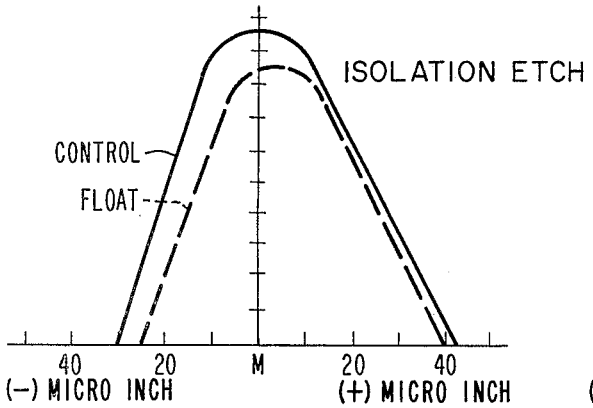
Figure 6:
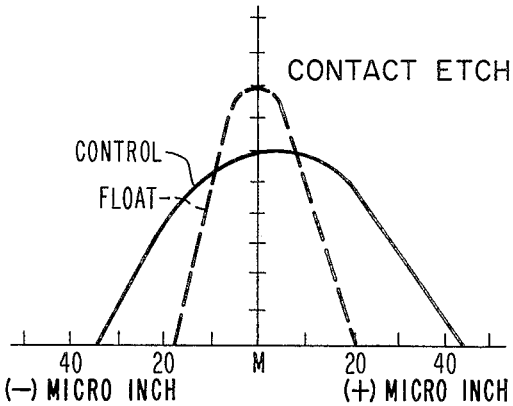
Figure 7:
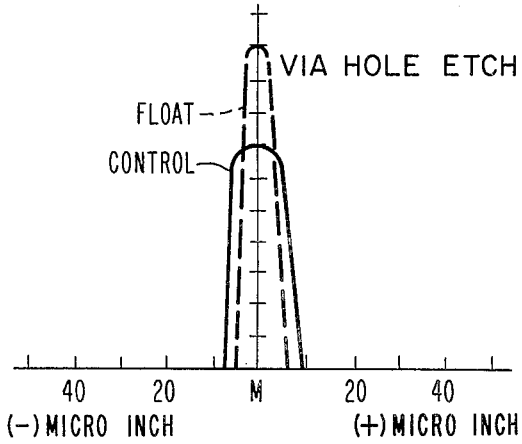

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MAY 4, 1976

946 O.G. 8

T946,003

FLOAT CONTACTING PROCESS AND APPARATUS

Patsy R. Fontanarosa, Yorktown Heights, Edward P. Hecker, Wappingers Falls, and Claude G. Metreaud, Fishkill, N.Y., assignors to International Business Machines Corporation, Armonk, N.Y.

Continuation of application Ser. No. 432,725, Jan. 11, 1974, which is a continuation of application Ser. No. 252,060, May 10, 1972, both now abandoned. This application Mar. 10, 1975, Ser. No. 556,610

Int. Cl. B08b *3/02, 3/08;* H01l *21/306*

U.S. Cl. 134—3

2 Sheets Drawing. 12 Pages Specification

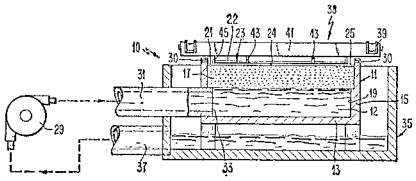

A process and apparatus for treating a workpiece, such as a semiconductor wafer, floats the wafer on the surface of a thin, 1/64 to 3/32 inch thick, agitated film of treating liquid. The film is renewed and agitated by fresh liquid which is fed as a multitude of small streams through the pores of a porous track member such as a sheet of porous polyethylene or a fine mesh screen. The streams provide a scrubbing action on the surface of the workpiece so as to uniformly remove portions of the surface. The apparatus includes a solid bottom and sidewalls which together with the porous track member form a plenum chamber. A pump continuously introduces a supply of treating liquid under pressure into the plenum chamber to cause the treating liquid to pass through the porous member to form the agitated thin film of treating liquid which treats and supports the workpiece. A collecting chamber is provided to collect the overflow of treating liquid so that it can be recirculated to the plenum chamber.